(12) United States Patent
Sato

(10) Patent No.: US 9,515,285 B2
(45) Date of Patent: Dec. 6, 2016

(54) DISPLAY DEVICE INCLUDING A LIGHT EMITTING LAYER CONTAINING QUANTUM DOTS

(71) Applicant: JAPAN DISPLAY INC., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/708,869

(22) Filed: May 11, 2015

(65) Prior Publication Data

US 2015/0333102 A1    Nov. 19, 2015

(30) Foreign Application Priority Data

May 16, 2014  (JP) ................................. 2014-102194

(51) Int. Cl.
| | |
|---|---|
| *H01L 29/06* | (2006.01) |
| *H01L 51/52* | (2006.01) |
| *H01L 27/15* | (2006.01) |
| *H01L 33/06* | (2010.01) |
| *H01L 33/38* | (2010.01) |

(Continued)

(52) U.S. Cl.
CPC ......... *H01L 51/5209* (2013.01); *H01L 27/156* (2013.01); *H01L 27/326* (2013.01); *H01L 33/06* (2013.01); *H01L 33/38* (2013.01); *H01L 33/505* (2013.01); *H01L 33/58* (2013.01); *H01L 51/5225* (2013.01); *H01L 51/5271* (2013.01); *H01L 27/322* (2013.01);

(Continued)

(58) Field of Classification Search
CPC ..... H01L 33/38; H01L 51/5209; H01L 27/322
See application file for complete search history.

(56) References Cited

U.S. PATENT DOCUMENTS

2005/0046342 A1* 3/2005 Park .................... H01L 27/3246
                                                                 313/504
2006/0244372 A1* 11/2006 Mikami .............. H01L 51/5036
                                                                 313/506

(Continued)

FOREIGN PATENT DOCUMENTS

| JP | 2010-520603 A | 6/2010 |
| JP | 5243534 B2 | 7/2013 |

OTHER PUBLICATIONS

Korean Office Action mailed on Aug. 8, 2016, for corresponding Korean Patent Application No. 10-2015-0060454.

*Primary Examiner* — Thao X Le
*Assistant Examiner* — Laura Dykes
(74) *Attorney, Agent, or Firm* — Typha IP LLC

(57) ABSTRACT

A display device includes a first insulating layer provided on a first surface of a first substrate; a second insulating layer including a plurality of openings exposing a part of the first insulating layer; and a plurality of light emitting elements including a first electrode located in each of the plurality of openings, the first electrode being located on a part of the first insulating layer in the opening and continuously on the second insulating layer and including an inclining surface on a side surface of the second insulating layer; a light emitting layer containing quantum dots, the light emitting layer being located on a part of the first electrode in the opening and including a side surface facing the inclining surface of the first electrode; and a second electrode located on the light emitting layer.

5 Claims, 18 Drawing Sheets

(51) Int. Cl.
*H01L 33/50* (2010.01)
*H01L 33/58* (2010.01)
*H01L 27/32* (2006.01)

(52) U.S. Cl.
CPC .... *H01L 27/3276* (2013.01); *H01L 2227/323* (2013.01); *H01L 2251/533* (2013.01)

(56) References Cited

U.S. PATENT DOCUMENTS

| | | | |
|---|---|---|---|
| 2008/0217602 A1 | 9/2008 | Kahen | |
| 2008/0297029 A1 | 12/2008 | Cok | |
| 2014/0239259 A1* | 8/2014 | Lim | H01L 51/5281 257/40 |
| 2014/0353630 A1* | 12/2014 | Baek | H01L 51/525 257/40 |
| 2015/0001474 A1* | 1/2015 | Park | H01L 51/5271 257/40 |

* cited by examiner

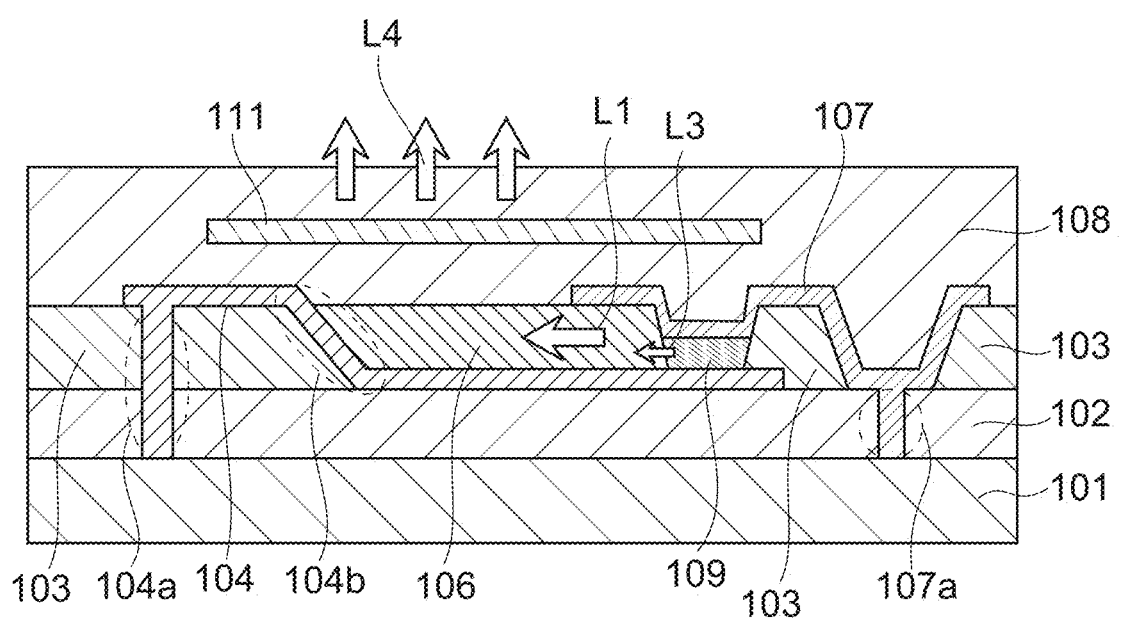

DISPLAY DEVICE INCLUDING A LIGHT EMITTING LAYER CONTAINING QUANTUM DOTS

CROSS REFERENCE TO RELATED APPLICATIONS

This application is based upon and claims the benefit of priority from the prior Japanese Patent Application No. 2014-102194, filed on May 16, 2014, the entire contents of which are incorporated herein by reference.

FIELD

The present invention relates to a display device including a light emitting layer containing quantum dots.

BACKGROUND

A light emitting element utilizing an electroluminescence (EL) phenomenon, when containing an appropriately selected light emitting material or when having an appropriately selected structure, emits light of various colors in a visible light region in addition to white color. Therefore, display devices and illumination devices using such a light emitting element have been actively developed.

Examples of light emitting elements utilizing the EL phenomenon include organic, inorganic and organic-inorganic hybrid light emitting diodes (LEDs). In a display device, a light emitting diode emits light when, for example, an electric current is supplied to a light emitting layer that is provided between a positive electrode provided for each of pixels located in a matrix and a negative electrode commonly provided for the pixels. Light is extracted through the negative electrode, which is transparent, and an image is displayed by light having a luminance and a chromaticity corresponding to each of the pixels. Display devices including such a light emitting diode are available in, for example, a type using a white light emitting layer and a color filter, and a type using a light emitting layer corresponding to each of the RGB colors and provided for each of pixels. The white light emitting layer may be formed by a general known method called a "tandem method", by which a plurality of light emitting layers are stacked.

As a light emitting material for a light emitting diode in a display device, various types of materials using quantum dots (QDs) have been proposed. A quantum dot is a nanometer-order semiconductor particulate. The quantum dot can have light emission thereof controlled by an external energy. Conventionally proposed display devices include, for example, a display device using an inorganic light emitting diode including an inorganic light emitting layer containing quantum dots (see, for example, Japanese PCT National-Phase Laid-Open Patent Publication No. 2010-520603), a display device including a light scattering layer containing quantum dots provided on a negative electrode of a light emitting diode (see, for example, Japanese Patent No. 5243534), and the like.

However, most of the above-described conventional display devices have a stacking structure in which light emitting layers or light scattering layers both containing quantum dots are stacked in a vertical direction, in which light is extracted. When such a display device is applied to a high-definition compact panel including minute pixels, a problem may possibly occur that light leaks to adjacent pixels to cause mixture of display colors, and thus an image cannot be displayed accurately.

SUMMARY

A display device in an embodiment according to the present invention includes a first insulating layer provided on a first surface of a first substrate; a second insulating layer including a plurality of openings exposing a part of the first insulating layer; and a plurality of light emitting elements including a first electrode located in each of the plurality of openings, the first electrode being located on a part of the first insulating layer in the opening and continuously on the second insulating layer and including an inclining surface on a side surface of the second insulating layer; a light emitting layer containing quantum dots, the light emitting layer being located on a part of the first electrode in the opening and including a side surface facing the inclining surface of the first electrode; and a second electrode located on the light emitting layer.

The plurality of light emitting elements may each further include a color conversion layer located on a part of the first electrode in the opening and adjacently to the side surface of the light emitting layer.

The plurality of light emitting elements may each further include a light emitting diode located on a part of the first electrode in the opening, adjacently to the side surface of the light emitting layer, and below the second electrode.

The plurality of openings may each have a tapering shape having a size in a horizontal direction decreasing toward the first insulating layer.

The first electrode may be a reflective electrode for reflecting light released from the light emitting layer.

The plurality of light emitting elements may each further include a color filter located on a part of the first electrode in the opening and adjacently to the side surface of the light emitting layer.

The plurality of light emitting elements may be respectively provided for a plurality of pixels; and the second electrode may be a reflective electrode provided for each of the plurality of pixels. Alternatively, the second electrode may be a transparent electrode provided commonly for the plurality of pixels.

The display device may further include a third insulating layer for covering an end of the first electrode on the second insulating layer. The second insulating layer may be located on the third insulating layer.

BRIEF EXPLANATION OF DRAWINGS

FIG. 6 is a cross-sectional view showing another modification example of the pixel in the display device in embodiment 1 according to the present invention;

DESCRIPTION OF EMBODIMENTS

The present invention has an object of, in a display device including a light emitting layer that contains quantum dots, preventing light leak to adjacent pixels and thus preventing color mixture among the pixels, so that light released from the light emitting layer can be effectively used as output light from each of the pixels. The present invention has an object of realizing such a structure of the display device, for improving the light extraction efficiency from each pixel, with a simple structure without significantly changing a currently used method for producing a display device.

Hereinafter, embodiments of the present invention will be described with reference to the drawings. The present invention is not limited to the following embodiments, and may be carried out in various forms without departing from the gist thereof.

Figure 1:
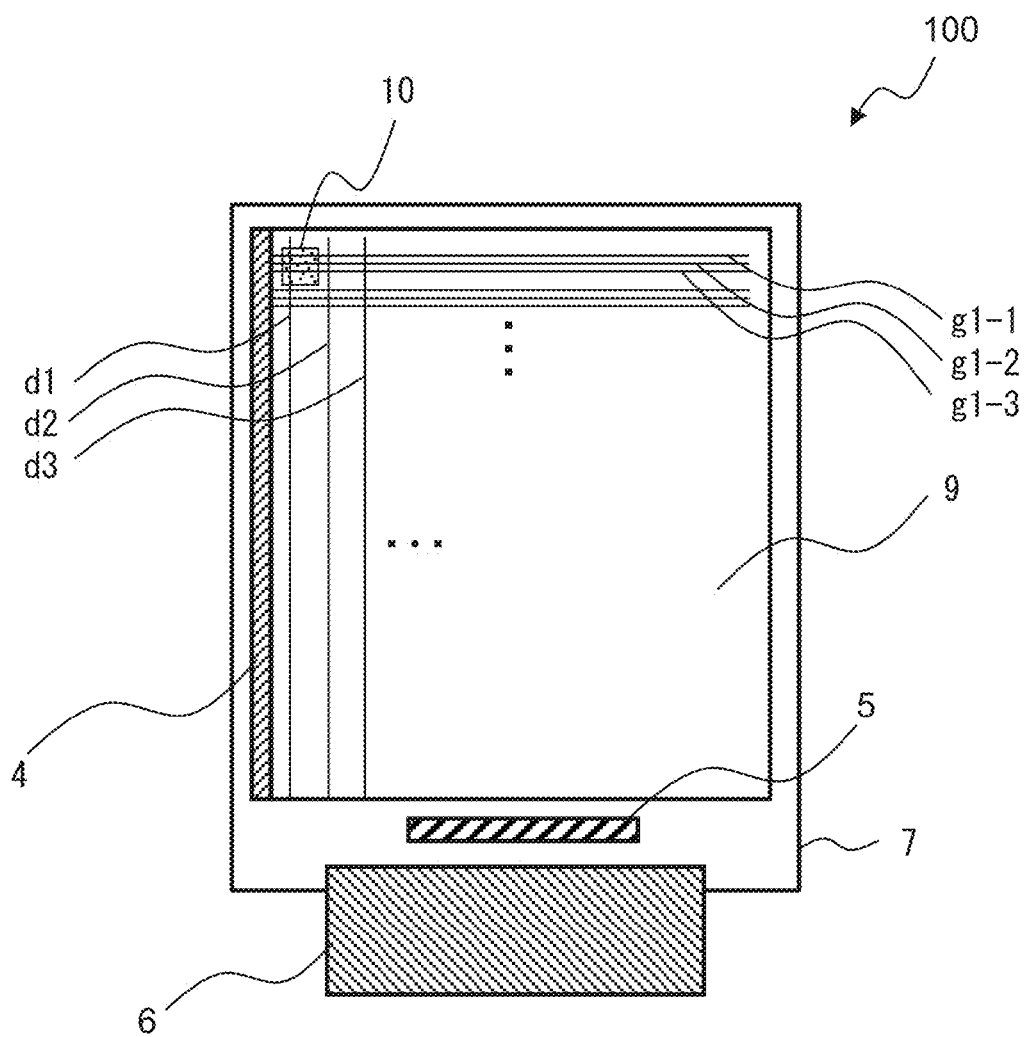
FIG. 1 is a plan view schematically showing a structure of a display device in an embodiment according to the present invention.

FIG. 1 schematically shows a structure of a display device 100 in an embodiment according to the present invention. The display device 100 in this embodiment includes a substrate 7, a display area 9, a driver IC 5, an FPC (Flexible Printed Circuit) 6, and a scanning line driving circuit 4. The display area 9, the driver IC 5, the FPC 6, and the scanning line driving circuit 4 are provided on the substrate 7. In the display area 9, a plurality of control signal lines g1-1-g1-3, . . . running in a lateral direction in FIG. 1 and a plurality of data signal lines d1, d2, d3, . . . running in a length direction in FIG. 1 cross each other. A plurality of pixels 10 are provided respectively at positions corresponding to intersections of the control signal lines g1-1-g1-3, . . . and the data signal lines d1, d2, d3, . . . ; namely, the plurality of pixels are located in a matrix.

In the structure shown in FIG. 1, for example, one pixel 10 is located at a position corresponding to the intersection of three control signal lines g1-1-g1-3 and one data signal line d1. The present invention is not limited to this. The plurality of pixels 10 are located in a direction parallel to the control signal lines g1-1-g1-3 (row direction) and in a direction parallel to the data signal line d1 (column direction). Therefore, the pixels 10 are located in a matrix. Although not shown, a line for supplying a certain voltage such as a power source line or the like may be provided in the display area 9. In each of the pixels 10, a pixel circuit is provided including a thin film transistor and a capacitor for holding a data voltage supplied from a corresponding data signal line among the data signal lines d1, d2, d3, . . . . Each pixel circuit controls write of the data voltage to the pixel 10 in accordance with a control signal supplied from a corresponding control signal line among the control signal lines g1-1-g1-3, . . . . Thus, each pixel circuit controls light emission of the corresponding pixel 10.

Each pixel 10 may include a plurality of sub pixels which emit light of different colors. For example, one pixel 10 may include three sub pixels which respectively emit light of the three primary colors (red (R), green (G) and blue (B)), or include four sub pixels which respectively emit light of the three primary colors (red (R), green (G) and blue (B)) and white color (W) or yellow color (Y). In the display area 9, each of the sub pixels included in the plurality of pixels 10 is driven with the light emission amount thereof being selectively adjusted, and thus an image is displayed.

Hereinafter, a structure of the pixels 10 in the display device 100 in an embodiment according to the present invention will be described by way of various examples.

Embodiment 1

Figure 2:
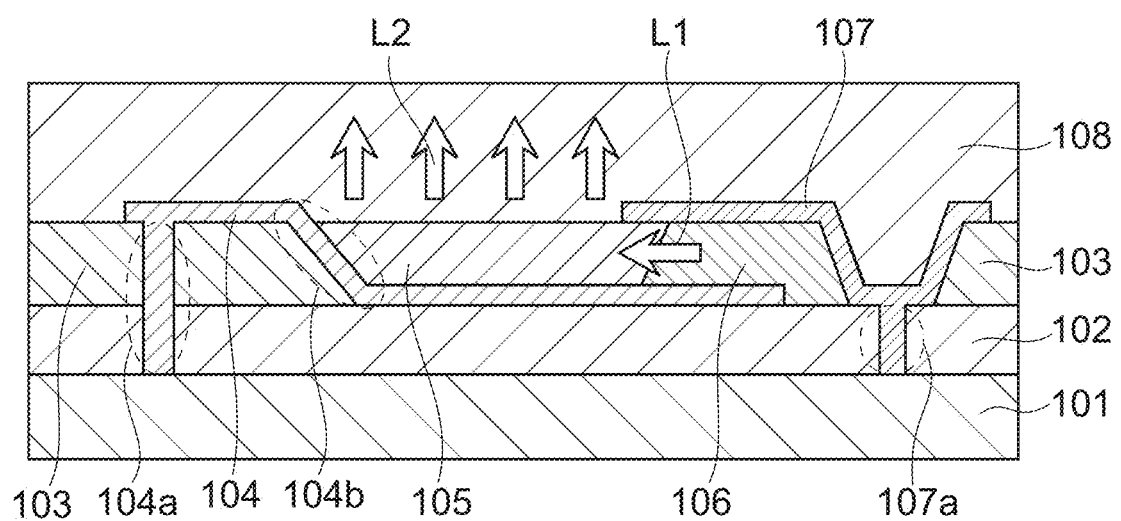
FIG. 2 is a cross-sectional view schematically showing a structure of a pixel in a display device in embodiment 1 according to the present invention.
Figure 3:
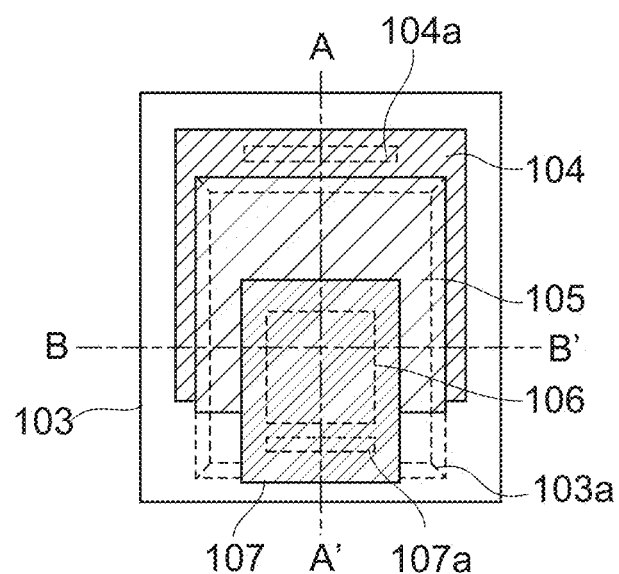
FIG. 3 is a plan view schematically showing a structure of the pixel in the display device shown FIG. 2.
Figure 4A:
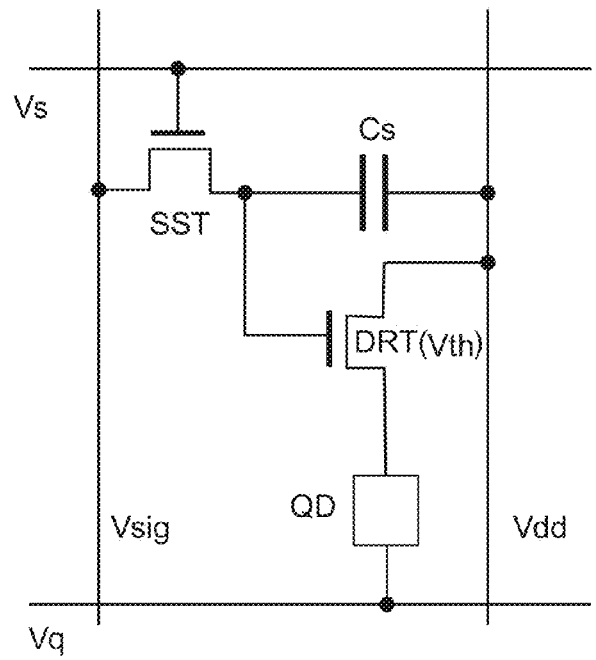
FIG. 4A and FIG. 4B provide circuit diagrams each showing an example of pixel circuit usable for the display device in embodiment 1 according to the present invention.
Figure 4B:
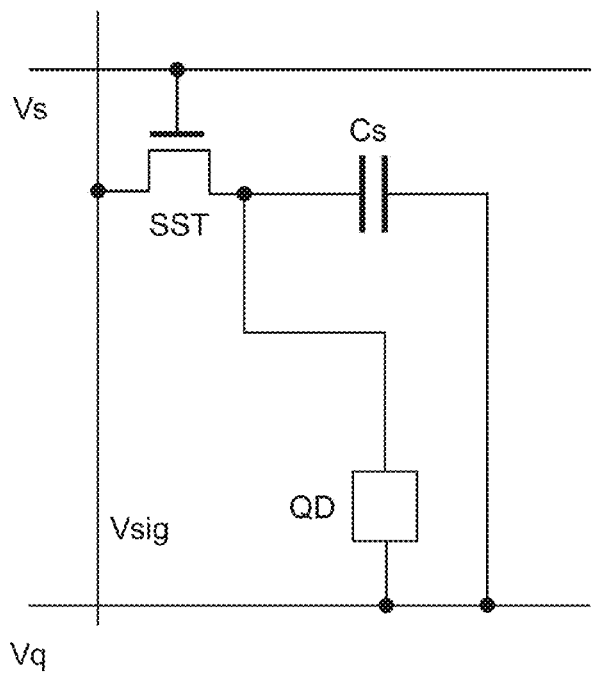

With reference to FIG. 2, FIG. 3, FIG. 4A and FIG. 4B, a structure of the pixels 10 included in the display device 100 in embodiment 1 according to the present invention will be described. FIG. 2 is cross-sectional view schematically showing a structure of one pixel 10 in the display device 100 in embodiment 1 according to the present invention. FIG. 3 is a plan view schematically showing a structure of the pixel 10 in the display device 100 shown in FIG. 2. FIG. 4A and FIG. 4B provide circuit diagrams each showing an example of pixel circuit usable in the display device 100 in embodiment 1 according to the present invention. In the following description, a side of the display device 100 on which the display area 9 is located and an image is visually recognized will be referred to as the top side of the display device 100.

As shown in FIG. 2, in the display device 100 in an embodiment according to the present invention, each pixel 10 includes a TFT substrate 101 including a thin film transistor (TFT) for controlling light emission of the pixel 10, a first insulating layer 102 located to cover a top surface of the TFT substrate 101, a second insulating layer 103 located on the first insulating layer 102 while having an opening (represented by reference sign 103a in FIG. 3) that exposes a part of a top surface of the first insulating layer 102, and a light emission element. The light emitting element includes a first electrode 104 located on a part of the first insulating layer 102 that is exposed by the opening of the second insulating layer 103 and continuously on the second insulating layer 103, a light emitting layer 106 containing quantum dots (QDs) and located on a part of the first electrode 104 that is in the opening of the second insulating layer 103, and a second electrode 107 located on the light emitting layer 106.

As shown in FIG. 2, each pixel 10 may include a color conversion layer 105 located on a part of the first electrode 104 that is in the opening of the second insulating layer 103 and adjacently to a side surface of the light emitting layer 106. The color conversion layer 105 contains a color conversion material (CCM) for converting the wavelength of light L1 released from the light emitting layer 106. A part of the first electrode 104 that is located below the color conversion layer 105 is used as a mirror electrode, so that the light L1 released from the light emitting layer 106 in a horizontal direction is incident on the color conversion layer 105 and then is reflected by the first electrode 104 to be directed upward. Thus, light L2 output from the color conversion layer 105 is directed toward the top surface of the display device 100, at which an image is visually recognized.

As shown in FIG. 2, a part of a top surface of the cover conversion layer 105 is exposed, namely, is not covered with the second electrode 107 covering the light emitting layer 106. The light L1 incident on the color conversion layer 105 is reflected by the first electrode 104 located below the color conversion layer 105, and is directed upward. Then, the light L1 is output upward as the light L2 from the part of the top surface of the color conversion layer 105 that is not covered with the second electrode 107.

As can be seen, in this embodiment, the light L1 output from the light emitting layer 106 is extracted from an area in which the first electrode 104, which is located below the color conversion layer 105 and is a lower electrode of the light emitting element, is exposed, namely, is not covered with the second electrode 107. The second electrode 107 is an upper electrode of the light emitting layer 106. The light L1 output from the light emitting layer 106 is incident on the color conversion layer 105 adjacent thereto in the horizontal direction, then is reflected by the first electrode 104 located below the color conversion layer 105, and is output upward. Therefore, the light can be extracted with less light loss. In this embodiment, the second electrode 107 covering the light emitting layer 106 is formed as an opaque mirror electrode. Because of this, external light from the outside of the display device 100 is prevented from being incident on the light emitting layer 106, and thus the quantum dots in the light emitting layer 106 are prevented from being excited by light that is not related to image display. In addition, the second electrode 107 covering the light emitting layer 106 prevents light that does not pass the color conversion layer 105 from leaking outside, and thus prevents undesired light from being mixed into the light L2.

As shown in FIG. 2, top surfaces of the first electrode 104, the second electrode 107, the color conversion layer 105 and the second insulating layer 103 are covered with a transparent sealing film 108. The sealing film 108 covering these components seals the light emitting element, including the first electrode 104, the light emitting layer 106 and the second electrode 107, against external air, so that the light emitting element is not exposed to moisture in the atmosphere.

FIG. 3 is a plan view showing the components shown in the cross-sectional view in FIG. 2 except for the sealing film 108. The cross-sectional view shown in FIG. 2 corresponds to a cross-sectional view taken along line A-A' in FIG. 3.

As shown in FIG. 2 and FIG. 3, a side surface of the second insulating layer 103 that defines the opening 103a may include an inclining surface directed upward, in which direction the light is extracted. The opening 103a may have a tapering shape having a size in the horizontal direction decreasing toward the first electrode 104. As described above, the side surface of the second insulating layer 103 is directed upward, in which direction the light is extracted, and is inclined so as to expand toward the outside of the pixel 10. As a result, the opening 103a has a bathtub-like shape, in which the first insulating layer 102 is a bottom surface and the inclining surface of the second insulating layer 103 is a side surface. The first insulating layer 102 acts as a flattening film covering the top surface of the TFT substrate 101, and the second insulating layer 103 acts as a bank layer demarcating a light emitting area of each pixel 10.

In the opening 103a, the first electrode 104 is located. The first electrode 104 is located from the top surface of a part of the first insulating layer 102 that is in the opening 103a and continuously on the top surface of the second insulating layer 103. Because of this, the first electrode 104 includes an inclining surface 104b on the inclining surface of the second insulating layer 103. The inclining surface 104b is directed upward, in which direction the light is extracted, and is inclined so as to expand toward the outside of the pixel 10. At a position facing the inclining surface 104b of the first electrode 104 in the horizontal direction, the side surface of the light emitting layer 106 is located. Therefore, the light L1 released from the side surface of the light emitting layer 106 in the horizontal direction is incident on the color conversion layer 105 and then is reflected by the inclining surface 104b of the first electrode 104. In other words, the light L1 incident on the color conversion layer 105 from the side surface of the light emitting layer 106 is reflected by the inclining surface 104b of the first electrode 104 located below the color conversion layer 105. As a result, the light L1 is not directed to the adjacent pixels 10 but is directed upward toward the top surface of the display device 100, at which an image is visually recognized. Thus, the light L2 output from the color conversion layer 105 is prevented from leaking to the adjacent pixels 10, which prevents color mixture among the pixels 10. Therefore, the light from the light emitting layer 106 can be effectively used as output light from each pixel 10. In this way, the display device 100 in embodiment 1 according to the present invention improves the light extraction efficiency from each pixel 10.

As shown in FIG. 2 and FIG. 3, the second electrode 107 located on the light emitting layer 106 may include a part extending from an end located on a top surface of the light emitting layer 106 as overlapping the first electrode 104 onto the side surface of the light emitting layer 106, a part located on the side surface of the light emitting layer 106 and continuously on the top surface of the first insulating layer 102, and a part located on the top surface of the first insulating layer 102 and continuously on the inclining surface of the second insulating layer 103. In order to prevent shortcircuiting between an end of the first electrode 104, located on the top surface of the first insulating layer 102, and the second electrode 107, the light emitting layer 106 provided between the first electrode 104 and the second electrode 107 is located on the top surface of the first insulating layer 102 to cover the end of the first electrode 104.

The first electrode 104 may have a structure in which an end thereof located on the second insulating layer 103 is connected to a source electrode or a drain electrode of the thin film transistor formed in the TFT substrate 101 via a through electrode 104a in a contact hole formed in the second insulating layer 103 and the first insulating layer 102. The second electrode 107 may have a structure in which the part located on the first insulating layer 102 is connected to a control voltage line formed in the TFT substrate 101 via a through electrode 107a in a contact hole formed in the first insulating layer 102 and is grounded.

Examples of circuit configuration of the pixel 10 having such a structure will be described with reference to FIG. 4A and FIG. 4B. In FIG. 4A and FIG. 4B, an element including the first electrode 104, the second electrode 107, and the light emitting layer 106 containing the quantum dots (QDs) that is located between the first electrode 104 and the second electrode 107 is represented by "QD".

FIG. 4A is a circuit diagram showing a structure in which the first electrode 104 for the light emitting layer 106 is connected to the drain electrode of the thin film transistor (drive transistor DRT) in the TFT substrate 101. The thin film transistor (drive transistor DRT) is provided for each pixel 10. As shown in FIG. 4A, the first electrode 104 is connected to the drain electrode of the driver transistor DRT, and the second electrode 107 is connected to a control voltage line Vq and is grounded. In FIG. 4A, the threshold voltage of the drive transistor DRT is represented by "Vth".

As shown in FIG. 4A, each pixel 10 includes a row selection switch SST including a source electrode connected to a video signal line Vsig, a gate electrode connected to a gate line Vs, and a drain electrode connected to a gate electrode of the drive transistor DRT and a storage capacitor Cs. One of two ends of the storage capacitor Cs may be connected to the drain electrode of the row selection switch SST, and the other end of the storage capacitor Cs may be connected to a power source line Vdd. The source electrode of the drive transistor DRT may be connected to the power source line Vdd. Because of such a structure, the light emission of the light emitting layer 106 in the "QD" shown in FIG. 4A can be controlled by a potential difference between the first electrode 104 and the second electrode 107.

Unlike the circuit configuration shown in FIG. 4A, the circuit configuration shown in FIG. 4B does not include the drive transistor DRT. As shown in FIG. 4B, the first electrode 104 in the "QD" may be connected to the drain electrode of the row selection switch SST, and the second electrode 107 in the "QD" may be connected to the control voltage line Vq. Even in the circuit configuration shown in FIG. 4B, in which no drive transistor DRT is included in each pixel 10, the light emission of the light emitting layer 106 in the "QD" can be controlled by a potential difference between the first electrode 104 and the second electrode 107. In the circuit configuration shown in FIG. 4B, charge accumulated in the storage capacitor Cs by the video signal line Vsig is used as an energy of the light emitting layer 106 in the "QD". The amount of charge accumulated in the storage capacitor Cs provides gray scale display. In order to significantly increase the capacitance of the storage capacitor Cs, a surface area expanding structure may be used. The surface area expanding structure is, for example, a stacking structure containing a High-K insulating material (insulating material having a high dielectric constant) or a three-dimensional multi-layer structure may be used. With such a surface area expanding structure, the energy of the light emitting layer 106 in the "QD" can be accumulated.

As described above, the display device 100 in embodiment 1 according to the present invention shown in FIG. 2, FIG. 3, FIG. 4A and FIG. 4B, the light emission of the light emitting layer 106 containing the quantum dots is controlled by a potential difference between the first electrode 104 and the second electrode 107. The light emission of the light emitting layer 106 containing the quantum dots is not limited to being controlled by the quantum dots being excited by an electric energy. The light emitting layer 106 may have a structure in which the light emission thereof is controlled by the quantum dots being excited by light. Hereinafter, with reference to FIG. 5 and FIG. 6, modification examples of the pixel 10 in embodiment 1 according to the present invention will be described. In these modification examples, the light emission of the light emitting layer 106 containing the quantum dots is controlled by light.

Figure 5:
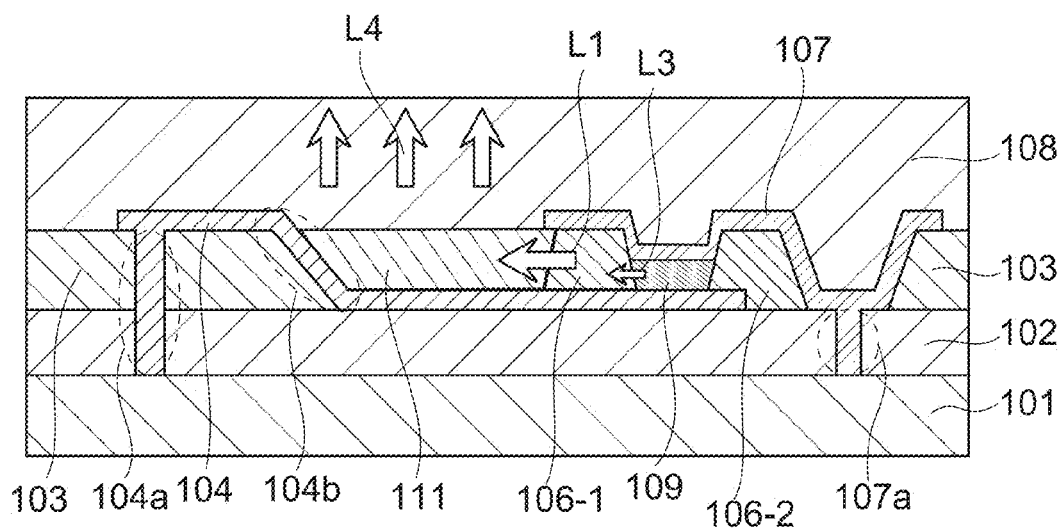
FIG. 5 is a cross-sectional view showing a modification example of the pixel in the display device in embodiment 1 according to the present invention.

FIG. 5 and FIG. 6 are each a cross-sectional view showing a modification example of the pixel 10 in the display device 100 in embodiment 1 according to the present invention. Unlike the pixel 10 in embodiment 1 according to the present invention shown in FIG. 2, a pixel 10 shown in each of FIG. 5 and FIG. 6 in the modification examples of embodiment 1 according to the present invention includes a light emitting diode 109 for supplying light to the light emitting layer 106 containing the quantum dots. The light emitting diode 109 is located between the first electrode 104 and the second electrode 107. The components substantially the same as those described above with reference to FIG. 2 through FIG. 4 will not be described in detail.

FIG. 5 is a cross-sectional view showing the pixel 10 in a display device 100a in a modification example of embodiment 1 according to the present invention. As shown in FIG. 5, a first light emitting layer 106-1 containing the quantum dots, the light emitting diode 109 and a second light emitting layer 106-2 containing the quantum dots may be located sequentially in the horizontal direction between the first electrode 104 and the second electrode 107. The first light emitting layer 106-1, the light emitting diode 109 and the second light emitting layer 106-2 shown in FIG. 5 are located at the position of the light emitting layer 106 in FIG. 2. The first light emitting layer 106-1, the light emitting diode 109 and the second light emitting layer 106-2 are located sequentially in the horizontal direction, such that the first light emitting layer 106-1 is positioned to emit the light L1 toward the inclining surface 104b of the first electrode 104. Top surfaces of the first light emitting layer 106-1, the light emitting diode 109 and the second light emitting layer 106-2 are covered with the second electrode 107.

When light L3 generated in the light emitting diode 109 is supplied to a side surface of the first light emitting layer 106-1 that is in contact with the light emitting diode 109, the first light emitting layer 106-1 releases the light L1. The second light emitting layer 106-2 is located on the top surface of the first insulating layer 102 to cover the end of the first electrode 104 in order to prevent shortcircuiting between the first electrode 104, located on the first insulating layer 102, and the second electrode 107. A side surface of the second light emitting layer 106-2 that is not in contact with the light emitting diode 109 is covered with the second electrode 107.

When an electric current is supplied to the first electrode 104 and the second electrode 107, the light emitting diode 109 emits light. The light L3 released from the light emitting diode 109 is incident on the first light emitting layer 106-1, which is adjacent thereto in the horizontal direction. The quantum dots in the first light emitting layer 106-1 are excited by the light L3 from the light emitting diode 109 and thus emit the light L1. The light emitting diode 109 may be, for example, an ultraviolet light emitting diode that generates UV light. The first light emitting layer 106-1 may have a function of converting the wavelength distribution of the light L3 supplied from the light emitting diode 109.

In the modification example shown in FIG. 5, a color filter 111 may be located at the position of the color conversion layer 105 in FIG. 2. The color filter 111 is located adjacent to the side surface of the first light emitting layer 106-1, and thus the light L1 output from the first light emitting layer 106-1 in the horizontal direction is incident on the color filter 111 with no leak. Light L4 which has passed the color filter 111 is reflected by the first electrode 104 located below the color filter 111, and is output upward, in which direction light is extracted.

FIG. 6 is a cross-sectional view showing the pixel 10 in a display device 100b in another modification example of embodiment 1 according to the present invention. As shown in FIG. 6, the light emitting layer 106, located adjacent to the side surface of the light emitting diode 109 from which the light L3 is output, may be located to cover the inclining surface 104b of the first electrode 104. A part of the top surface of the light emitting layer 106 is exposed, namely, is not covered with the second electrode 107, and acts as an area where the light L1 is extracted. As can be seen, in the modification example shown in FIG. 6, the light emitting layer 106 containing the quantum dots may be located at the position of the first light emitting layer 106-1 and the color filter 111 in FIG. 5.

In the modification example shown in FIG. 6, the second insulating layer 103 may be located at the position of the second light emitting layer 106-2 in FIG. 5. The second insulating layer 103 is located to cover the end of the first electrode 104, and thus the shortcircuiting between the first electrode 104 and the second electrode 107 is prevented.

In the modification example shown in FIG. 6, like in the modification example shown in FIG. 5, the light L3 generated in the light emitting diode 109 that is located between the first electrode 104 and the second electrode 107 is incident on the light emitting layer 106, which is adjacent to the light emitting diode 109 in the horizontal direction. The quantum dots in the light emitting layer 106 are excited by the light L3 from the light emitting diode 109 and thus emit the light L1. The light emitting layer 106 may have a function of converting the wavelength distribution of the light L3 supplied from the light emitting diode 109.

In the modification example shown in FIG. 6, the light emitting layer 106 is located on the inclining surface 104b of the first electrode 104. Therefore, the light L1 generated in the light emitting layer 106 is reflected by the first electrode 104 located below the light emitting layer 106, and is output upward through the exposed area of the top surface of the light emitting layer 106, namely, the area that is not covered with the second electrode 107.

As shown in FIG. 6, the color filter 111 may be located in the sealing film 108 located on the light emitting layer 106. Unlike in the modification example shown in FIG. 5, in the modification example shown in FIG. 6, the color filter 111 is located in the sealing film 108, namely, with no contact with the side surface of the light emitting layer 106. Therefore, even if the color filter 111 is contaminated, the light emitting layer 106 is not influenced by the contamination. The light L1 generated in the light emitting layer 106 passes the color filter 111, and thus light L4 of a color corresponding to each of the pixels 10 is extracted.

As described above, the light emitting layer 106 containing the quantum dots may have a structure of emitting light by excitation of the quantum dots caused by an electric energy as shown in FIG. 2, FIG. 3, FIG. 4A and FIG. 4B, or may have a structure of emitting light by excitation of the quantum dots caused by light and releasing wavelength-converted light as shown in FIG. 5 and FIG. 6.

Hereinafter, a method for producing the display device 100 in an embodiment according to the present invention having the above-described structure will be described with reference to FIG. 7A through FIG. 7E.
(Method for Producing the Display Device 100)

FIG. 7A through FIG. 7E are each a cross-sectional view showing a step of production of the pixel 10 in the display device 100 in an embodiment according to the present invention. The cross-sectional views shown in FIG. 7A through FIG. 7E each correspond to a cross-sectional view taken along line B-B' in FIG. 3. The cross-sectional views shown in FIG. 7A through FIG. 7E are of one pixel 10. In actual production, components corresponding to a plurality of display devices 100 each including a plurality of pixels 10 are formed, and then are divided into individual display devices 100.

Figure 7A:
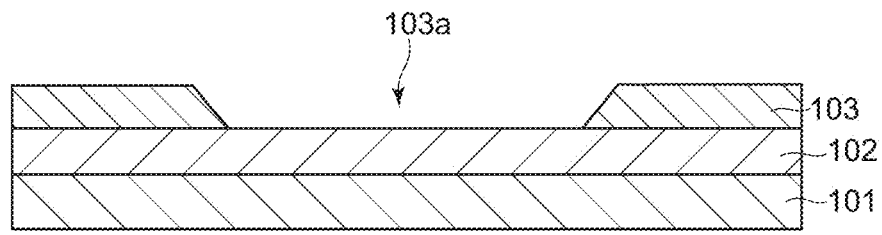
FIG. 7A, FIG. 7B, FIG. 7C, FIG. 7D and FIG. 7E provide cross-sectional views showing a method for producing a display device in an embodiment according to the present invention.

The display device 100 in an embodiment according to the present invention is produced as follows. First, as shown in FIG. 7A, the first insulating layer 102 and the second insulating layer 103 are sequentially stacked on the TFT substrate 101. Then, a part of the second insulating layer 103 is removed to form the opening 103a exposing the top surface of the first insulating layer 102.

The TFT substrate 101 includes a substrate formed of, for example, glass or the like, and a TFT driving circuit layer provided on the substrate. The TFT driving circuit layer includes a pixel circuit formed therein. The pixel circuit includes a plurality of lines and light emission control elements such as thin film transistors or the like connected to the plurality of lines as described above with reference to FIG. 4A. The first insulating layer 102 is formed as a flattening film covering the TFT driving circuit layer. The first insulating layer 102 may be formed of, for example, a photosensitive resin such as an acrylic resin, polyimide or the like, by use of a known technology such as spin coating or the like.

On the first insulating layer 102, the second insulating layer 103 is formed. The second insulating layer 103 may be formed of a photosensitive resin such as an acrylic resin, polyimide or the like, or alternatively, silicon oxide, silicon nitride or the like. After the second insulating layer 103 is formed on the entire top surface of the first insulating layer 102, the opening 103a is formed in the second insulating layer 103 by patterning to expose a part of the top surface of the first insulating layer 102.

The opening 103a is formed in an area corresponding to the light emitting area of each pixel 10. The opening 103a is formed to have a tapering shape having a size in the horizontal direction decreasing toward the first insulating layer 102. As a result, the side surface of the second insulating layer 103 that defines the opening 103a includes an inclining surface directed upward and inclined so as to expand toward the outside of the pixel 10. The opening 103a may have a bathtub-like shape, in which the first insulating layer 102 is a bottom surface and the inclining surface of the second insulating layer 103 is a side surface. The inclining surface of the second insulating layer 103 desirably has an angle of 30 degrees with respect to a horizontal plane. The tapering shape of the second insulating layer 103 may be formed as follows. During photolithography performed by use of, for example, a self-photosensitive acrylic resin or polyimide, development and baking are performed after exposure. The tapering shape is formed automatically in this manner. The tapering angle can be controlled by performing baking a plurality of times at different temperatures.

In the first insulating layer 102 and the second insulating layer 103 thus formed, a plurality of contact holes (not shown in FIG. 7A) are formed that expose a part of the thin film transistor and a part of the lines in each pixel circuit formed in the TFT substrate 101. In the plurality of contact holes, through electrodes 104a and 107a (not shown in FIG. 7A) through which the first electrode 104 and the second electrode 107 are connected to the thin film transistor and the lines in each pixel circuit are formed in a step described later.

Figure 7B:
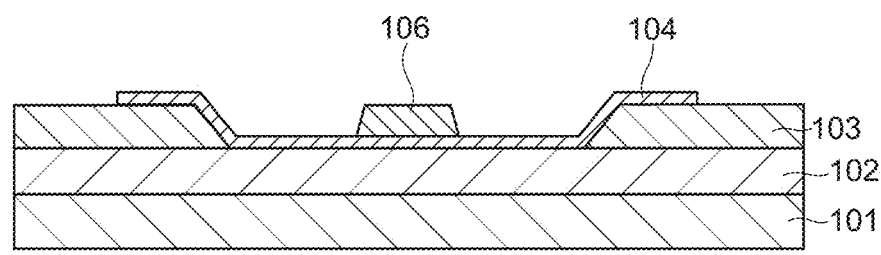

Next, as shown in FIG. 7B, the first electrode 104 is formed on a part of the first insulating layer 102 that is exposed by the opening 103a and continuously on the second insulating layer 103. The first electrode 104 is formed so as to form a reflective electrode (mirror electrode) by use of, for example, silver, aluminum or the like. The first electrode 104 is formed to have the structure described above with reference to FIG. 2 and FIG. 3 by use of patterning. The first electrode 104 is formed to be located on the top surface of the first insulating layer 102 and continuously on the top surface of the second insulating layer 103. As a result, the inclining surface 104b is formed on, and along, the inclining surface of the second insulating layer 103. Concurrently with the formation of the first electrode 104, the through electrode 104a is formed in the contact hole formed in the first insulating layer 102 and the second insulating layer 103.

On the first electrode 104 thus formed, the light emitting layer 106 containing the quantum dots is formed. The light emitting layer 106 containing the quantum dots is formed in the opening 103a such that side surface of the light emitting layer 106 faces the inclining surface 104b of the first electrode 104. Hereinafter, an example of structure of the light emitting layer 106 containing the quantum dots, and an example of method for producing the same will be described.

The light emitting layer 106 containing the quantum dots includes a light-transmissive member and semiconductor particulate fluorescent elements. The semiconductor particulate fluorescent elements are each an element containing a semiconductor fine crystalline particle and the semiconductor fine crystalline particle corresponds to a "quantum dot". The semiconductor particulate fluorescent elements are dispersed in the light emitting layer 106. The light-transmissive member seals the semiconductor particulate fluorescent elements therein in a dispersed state, and is desirably formed of a material that does not absorb light emitted from the semiconductor particulate fluorescent elements.

The light-transmissive member of the light emitting layer 106 is desirably formed of a material that does not transmit moisture or oxygen. This prevents entrance of moisture or oxygen into the light emitting layer 106. Such a material usable for the light-transmissive member may be, for example, a light-transmissive resin material such as a silicone resin, an epoxy resin, an acrylic resin, a fluorine resin, a polycarbonate resin, a polyimide resin, a urea resin, or the like; or a light-transmissive inorganic material such as aluminum oxide, silicon oxide, yttria or the like.

A semiconductor particulate fluorescent element of the light emitting layer 106 may have a structure generally referred to as a "core structure". The semiconductor particulate fluorescent element having a core structure includes a core part. The core part is formed of a semiconductor fine crystalline particle (quantum dot) having a diameter of about several nanometers, and forms a light emitting part that emits light as a result of recombination of electrons and holes.

Alternatively, the semiconductor particulate fluorescent element may have a structure generally referred to as a "core/shell structure". The semiconductor particulate fluorescent element having a core/shell structure includes a core part, which is a light emitting part, and a shell part covering the core part. The shell part is formed of a material different from that of the core part, and has a function of protecting the core part against external adverse influence. The shell part is desirably formed of a material having larger bandgap energy than that of the core part. The shell part formed of such a material provides a function of confining the electrons and the holes in the core part of the semiconductor particulate fluorescent element. As a result, loss of the electrons and holes due to non-radiative transition is reduced, and therefore, the light emission efficiency is improved.

On a surface of the core part of the semiconductor particulate fluorescent element having a core structure, or on a surface of the shell part of the semiconductor particulate fluorescent element having a core/shell structure, an organic compound bindable to the core part or the shell part may be provided.

The semiconductor particulate fluorescent element may have a multi-shell structure instead of the core structure or the shell structure. Examples of the multi-shell structure include a core/shell/shell structure and a shell/core/shell structure. The semiconductor particulate fluorescent element having the core/shell/shell structure includes the core/shell structure and a shell part formed of another material provided outer to the shell part of the core/shell structure. The semiconductor particulate fluorescent element having the shell/core/shell structure includes a shell part located at the center, a core part covering the shell part, and another shell part covering the core part.

The semiconductor particulate fluorescent element having any of the above-described structures can optionally adjust the light emission wavelength. A reason for this is that the quantum confinement effect, which is caused when the diameter of the semiconductor fine crystalline particle is decreased to smaller than or equal to twice the Bohr radius, can be used. The bandgap energy of the core part of the semiconductor particulate fluorescent element is changed by the quantum confinement effect corresponding to the diameter. Therefore, the diameter may be adjusted to change the bandgap energy, so that the light emission wavelength can be optionally adjusted. The core part of the semiconductor particulate fluorescent element may be formed of a mixed crystal material. In this case, the light emission wavelength can be optionally adjusted by adjusting the mixing ratio of the materials.

The semiconductor particulate fluorescent element may have any light emission wavelength in accordance with the use thereof. In this embodiment, a semiconductor particulate fluorescent element having a light emission wavelength in the visible light region is preferable. Examples of the light emission wavelength region are 420 to 480 nm for a semiconductor particulate fluorescent element for emitting blue light, 500 to 565 nm for a semiconductor particulate fluorescent element for emitting green light, 565 to 585 nm for a semiconductor particulate fluorescent element for emitting yellow light, and 595 to 720 nm for a semiconductor particulate fluorescent element for emitting red light.

The core part of the semiconductor particulate fluorescent element may be formed of, for example, a group IV semiconductor material, a group IV-IV semiconductor material, a group III-V compound semiconductor material, a group II-VI compound semiconductor material, a group I-VIII compound semiconductor material, a group IV-VI compound semiconductor material or the like. Alternatively, the core part of the semiconductor particulate fluorescent element may be formed of a single component semiconductor material formed of crystals of one type of chemical element, a two-component compound semiconductor material formed of crystals of two types of chemical elements, or a mixed crystal semiconductor material formed of crystals of three or more types of chemical elements. In order to improve the light emission efficiency, it is desirable that the core part is formed of a semiconductor particulate that is formed of a direct transition type semiconductor material.

It is desirable that the semiconductor particulate that forms the core part emits visible light as described above. From the viewpoint of durability, it is desirable that the semiconductor particulate that forms the core part is formed of a group III-V compound semiconductor material, which has a strong binding force of atoms and thus is chemically highly stable. In order to make easy the adjustment of the peak wavelength of the light emission spectrum of the semiconductor particulate fluorescent element, it is desirable that the core part is formed of a mixed crystal semiconductor material. In the meantime, in order to facilitate the production, it is desirable that the core part is formed of a semiconductor particulate fluorescent element formed of four or less types of chemical elements.

Examples of the two-component compound semiconductor material usable for the core part of the semiconductor particulate fluorescent element include InP, InN, InAs, GaAs, CdSe, CdTe, ZnSe, ZnTe, PbS, PbSe, PbTe, CuCl, and the like.

Examples of the three-component mixed crystal semiconductor material usable for the core part of the semiconductor particulate fluorescent element include InGaP, AlInP, InGaN, AlInN, ZnCdSe, ZnCdTe, PbSSe, PbSTe, PbSeTe, and the like.

The shell part of the semiconductor particulate fluorescent element may be formed of, for example, a group IV semiconductor material, a group IV-IV semiconductor material, a group III-V compound semiconductor material, a group II-VI compound semiconductor material, a group I-VIII compound semiconductor material, a group IV-VI compound semiconductor material or the like. Alternatively, the shell part of the semiconductor particulate fluorescent element may be formed of a single component semiconductor material formed of crystals of one type of chemical element, a two-component compound semiconductor material formed of crystals of two types of chemical elements, or a mixed crystal semiconductor material formed of crystals of three or more types of chemical elements. As described above, in order to improve the light emission efficiency of the display device, it is desirable that the shell part is formed of a material having a higher bandgap material than that of the core part.

From the viewpoint of protection of the core part, it is desirable that the semiconductor particulate that forms the shell part is formed of a group III-V compound semiconductor material, which has a strong binding force of atoms and thus is chemically highly stable. In the meantime, in order to facilitate the production, it is desirable that the shell part is formed of a semiconductor particulate fluorescent element formed of four or less types of chemical elements.

Examples of the two-component compound semiconductor material usable for the shell part of the semiconductor particulate fluorescent element include AlP, GaP, AlN, GaN, AlAs, ZnO, ZnS, ZnSe, ZnTe, MgO, MgS, MgSe, MgTe, CuCl, and the like.

Examples of the three-component mixed crystal semiconductor material usable for the shell part of the semiconductor particulate fluorescent element include AlGaN, GaInN, ZnOS, ZnOSe, ZnOTe, ZnSSe, ZnSTe, ZnSeTe, and the like.

The organic compound material bindable to the surface of the semiconductor particulate fluorescent element preferably includes a functional part formed of an alkyl group and a bindable part that is bindable to the core part or the shell part of the semiconductor particulate fluorescent element. Specific examples of such an organic compound material include an amine compound, a phosphine compound, a phosphine oxide compound, a thiol compound, a fatty acid, and the like.

The semiconductor particulate fluorescent element of the light emitting layer 106 having such a structure may be produced by any of various known synthesis methods. Usable methods include, for example, a gas phase synthesis method, a liquid phase synthesis method, a solid phase synthesis method, a vacuum synthesis method, and the like. Examples of the liquid phase synthesis method include a hot soap method, a reverse micelle method, a solvothermal method, a hydrothermal method, a coprecipitation method, and the like.

The semiconductor particulate fluorescent elements formed by such a production method are incorporated into, and dispersed in, a liquid resin such as a silicone resin or the like of the light-transmissive member. Thus, a quantum dot suspension is formed. The quantum dot suspension having the semiconductor particulate fluorescent elements dispersed therein may be applied to a desirable position on the first electrode 104 by use of a known method such as a printing method or the like. The liquid resin contained in the quantum dot suspension is, for example, UV-cured or thermally cured to form the light emitting layer 106 containing the quantum dots on the first electrode 104 as shown in FIG. 7B.

Figure 7C:
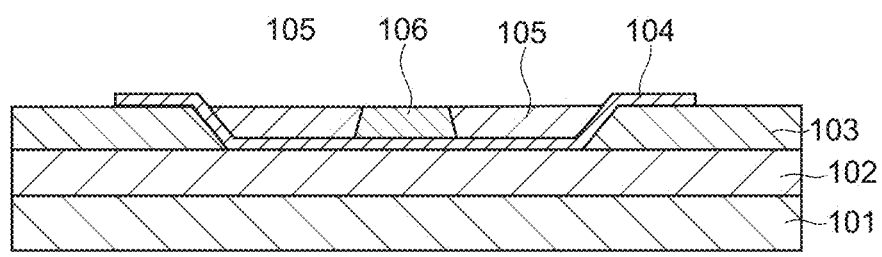

Next, as shown in FIG. 7C, the color conversion layer 105 is formed on the first electrode 104 and adjacently to the side surface of the light emitting layer 106. The color conversion layer 105 is formed of a fluorescent material or a phosphorescent material each having a color conversion function. The color conversion layer 105 may be formed of, for example, a known organic or inorganic fluorescent material suitable to the color to be converted. For the color conversion layer 105, a material from which light having a desirable light emission wavelength can be extracted is selected. The color conversion layer 105 thus formed is patterned to be at a position where the color conversion layer 105 covers the inclining surface 104b of the first electrode 104 with the shape described above with reference to FIG. 2 and FIG. 3.

Figure 7D:
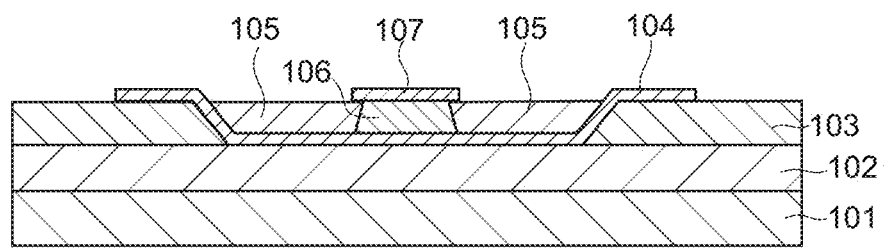

Next, as shown in FIG. 7D, the second electrode 107 is formed on the light emitting layer 106. The second electrode 107 is formed as an opaque mirror electrode by use of aluminum or the like. The second electrode 107 is patterned to be at a position where the second electrode 107 covers the top surface of the light emitting layer 106 with the shape described above with reference to FIG. 2 and FIG. 3. Concurrently with the formation of the second electrode 107, the through electrode 107a is formed in the contact hole formed in the first insulating layer 102.

Figure 7E:
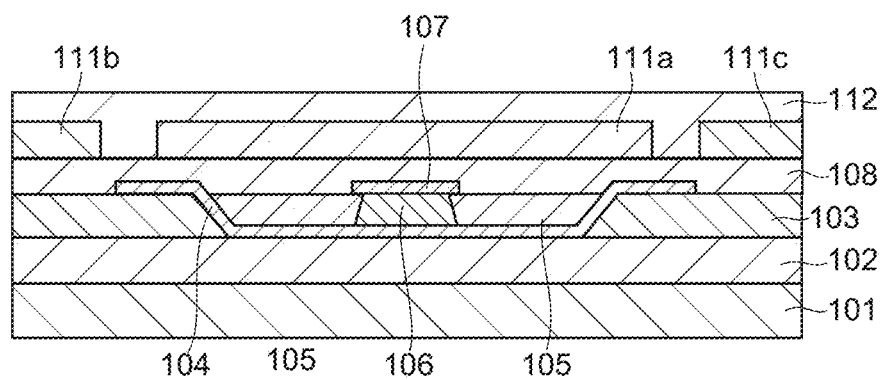

Next, as shown in FIG. 7E, the sealing film 108 covering the entire surfaces of the first electrode 104, the second electrode 107, the color conversion layer 105 and the second insulating layer 103 is formed. The sealing film 108 may be formed of a material such as silicon nitride or the like by use of a known method such as a CVD method or the like.

On the sealing film 108, color filters 111a through 111c are formed. The color filters 111a through 111c respectively correspond the three primary colors (red (R), green (G) and blue (B)), and are respectively located in correspondence with the light emitting areas of the pixels 10. A substrate 112 having a black matrix or the like in addition to the color filters 111a through 111c formed thereon may be bonded to the sealing film 108 with a sealing material or the like.

As described above, the display device 100 in embodiment 1 according to the present invention can be realized with a simple structure by use of a known technology without significantly changing a currently used production method. In each of the pixels 10 in the display device 100 produced by such a production method, the light L1 released from the light emitting layer 106 is directed upward to be output by the inclining surface 104b of the first electrode 104 without being directed to the adjacent pixels 10, as described above.

As described above, in the display device 100 in embodiment 1 according to the present invention, the light emitting layer 106, the color conversion layer 105 and the like included in the light emitting element are not stacked in the vertical direction in which light is extracted, but are located sequentially in the horizontal direction. Therefore, the light L1 output from the light emitting layer 106 is prevented from being lost. In addition, the inclining surface 104b of the first electrode 104 is used as a reflective electrode. Therefore, light leak to the adjacent pixels 10 is prevented, and thus the light L1 output from the light emitting layer 106 can be effectively used as output light from each pixel 10.

The display device 100 in embodiment 1 according to the present invention, even when being applied to a high-definition display, prevents light leak to the adjacent pixels, and thus prevents color mixture. Therefore, the light extraction efficiency from each pixel 10 is improved.

Embodiment 2

Hereinafter, a structure of a display device 200 in embodiment 2 according to the present invention will be described with reference to FIG. 8 through FIG. 11.

Figure 8:
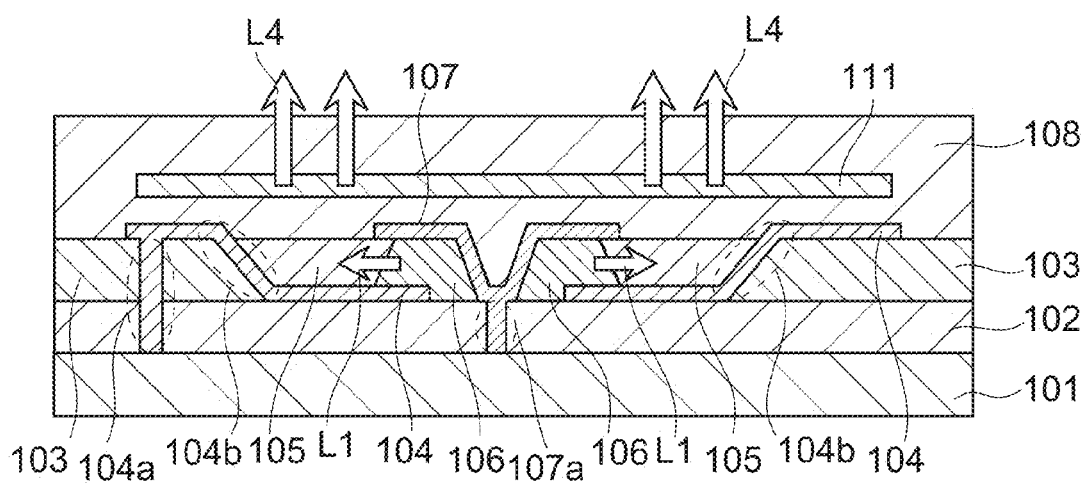
FIG. 8 is a cross-sectional view schematically showing a structure of a pixel in a display device in embodiment 2 according to the present invention.
Figure 9A:
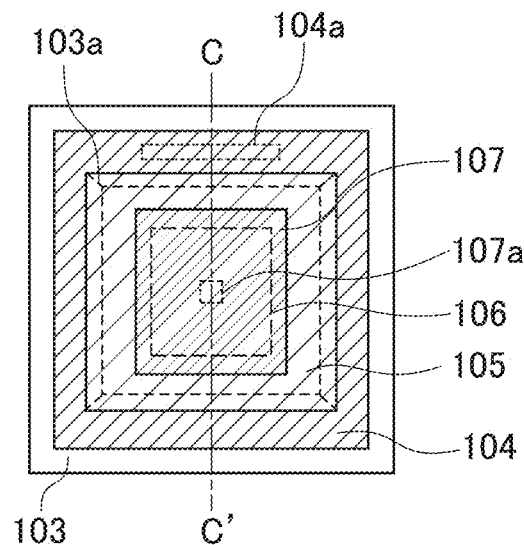
FIG. 9A and FIG. 9B provide plan views each schematically showing a structure of the pixel in the display device shown FIG. 8.
Figure 9B:
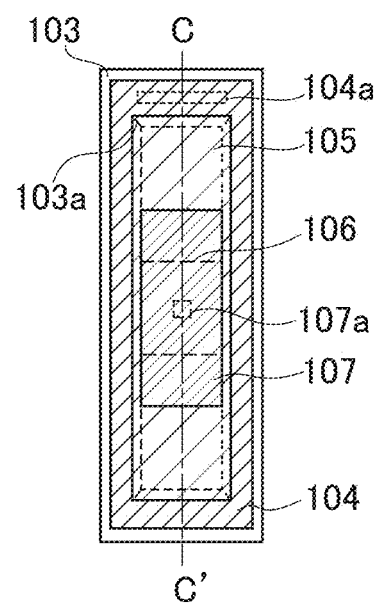
Figure 10:
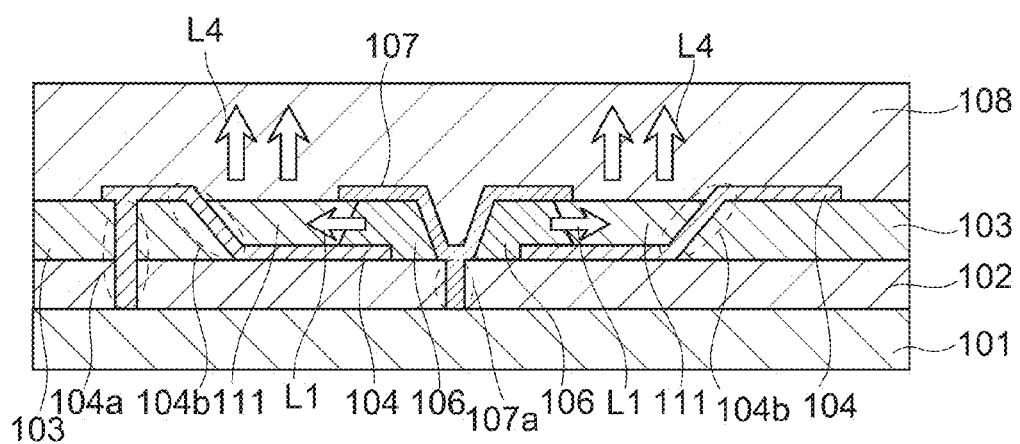
FIG. 10 is a cross-sectional view showing a modification example of the pixel in the display device in embodiment 2 according to the present invention.
Figure 11:
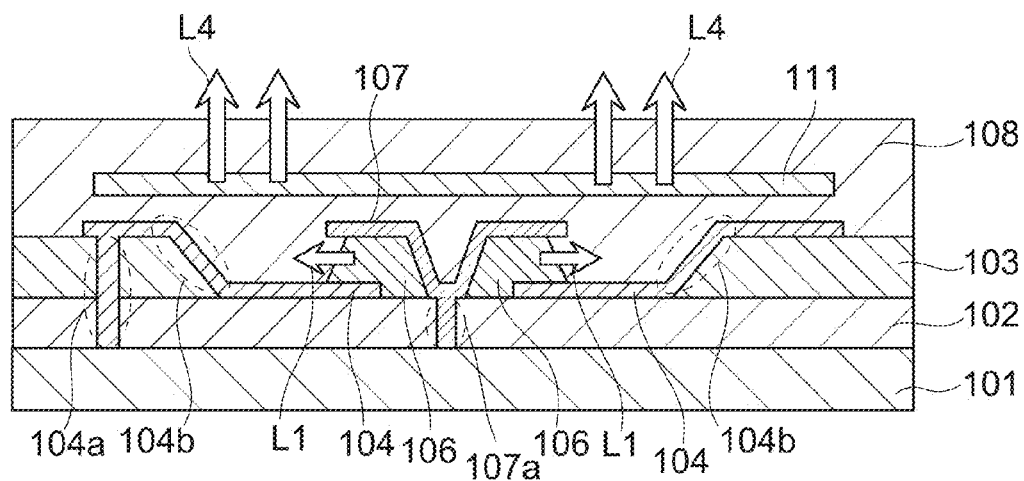
FIG. 11 is a cross-sectional view showing another modification example of the pixel in the display device in embodiment 2 according to the present invention.

FIG. 8 is a cross-sectional view schematically showing a structure of a pixel 10 in the display device 200 in embodiment 2 according to the present invention. FIG. 9A and FIG. 9B provide plan views each schematically showing a structure of the pixel 10 in the display device 200 shown in FIG. 8. FIG. 10 is a cross-sectional view showing a modification example of the pixel 10 in the display device 200 in embodiment 2 according to the present invention. FIG. 11 is a cross-sectional view showing another modification example of the pixel 10 in the display device 200 in embodiment 2 according to the present invention.

Unlike in the pixel 10 in embodiment 1 according to the present invention shown in FIG. 2, FIG. 3, FIG. 4A and FIG. 4B, in the pixel 10 in embodiment 2 according to the present invention shown in FIG. 8 through FIG. 11, the light emitting layer 106 containing the quantum dots and the second electrode 107 are located at a substantially central position of the pixel 10, and the inclining surface 104b of the first electrode 104 is located to enclose the light emitting layer 106 containing the quantum dots. The components substantially the same as those of the pixel 10 in embodiment 1 according to the present invention described above with reference to FIG. 2, FIG. 3, FIG. 4A and FIG. 4B will not be described in detail.

As shown in FIG. 9A and FIG. 9B, the through electrode 107b of the second electrode 107 is located at a substantially central position of the pixel 10 in embodiment 2. The light emitting layer 106 is located to enclose the through electrode 107b, and the top surface of the light emitting layer 106 is covered with the second electrode 107. FIG. 9A shows an example of planar structure of the pixel 10 in the case where the pixels 10 are located in a square lattice. FIG. 9B shows an example of planar structure of the pixel 10 in the case where the pixels 10 are located in stripes.

As shown in FIG. 8, FIG. 9A and FIG. 9B, the first electrode 104 is located to cover a part of the top surface of the first insulating layer 102 that is in the opening 103a and continuously the top surface of the second insulating layer 103 except for a substantially central area of the pixel 10 in which the second electrode 107 and the light emitting layer 106 are located. The light emitting layer 106 is located between the first electrode 104 and the second electrode 107. The color conversion layer 105 is located adjacent to the side surface of the light emitting layer 106 that is on the first electrode 104. The color conversion layer 105 located adjacent to the light emitting layer 106 is located to cover the inclining surface 104b of the first electrode 104 in the opening 103a. In this embodiment, the second electrode 107 is located to cover only the top surface of the light emitting layer 106, and therefore, most of the top surface of the color conversion layer 105 is not covered with the second electrode 107.

The light L1, released from the light emitting layer 106 located between the first electrode 104 and the second electrode 107, proceeds in the horizontal direction and is incident on the color conversion layer 105 located adjacent to, and around, the light emitting layer 106. The light L1 incident on the color conversion layer 105 is reflected by the first electrode 104 located below the color conversion layer 105, and is output upward from the top surface of the color conversion layer 105 that is exposed, namely, is not covered with the second electrode 107. The light directed toward the outside of the pixel 10 is reflected by the inclining surface 104b of the first electrode 104 to be directed upward, namely, toward above the pixel 10, and thus is output. This prevents the light from leaking to the adjacent pixels 10.

The color filter 111 may be located in the sealing film 108. In this case, the light output from the color conversion layer 105 passes the color filter 111, and thus the light L4 of a color corresponding to each pixel 10 is extracted.

FIG. 10 is a cross-sectional view showing the display device 200a in a modification example of embodiment 2 according to the present invention shown in FIG. 8. As shown in FIG. 10, the color filter 111 may be located at the position of the color conversion layer 105 in FIG. 8, namely, on the first electrode 104 and adjacently to the side surface of the light emitting layer 106. In this case, the light L1 output from the light emitting layer 106 is incident on the color filter 111 that is adjacent thereto in the horizontal direction and is reflected by the first electrode 104 located below the color filter 111. Thus, the light L4 of a color corresponding to each pixel 10 is extracted.

FIG. 11 is a cross-sectional view showing the display device 200b in another modification example of embodiment 2 according to the present invention shown in FIG. 8. As shown in FIG. 11, the transparent sealing film 108 may be located on the first electrode 104 and adjacently to the side surface of the light emitting layer 106. In other words, an area where the color conversion layer 105 is located in FIG. 8 or the color filter 111 is located in FIG. 10, namely, a space in the opening 103a that is enclosed by the light emitting layer 106 and the first electrode 104 in FIG. 11, may be filled with the sealing film 108. In this case, the light L1, released from the light emitting layer 106, proceeds in the horizontal direction and is reflected by the first electrode 104 to be directed upward. More specifically, the inclining surface 104b of the first electrode 104 is located to face the side surface of the light emitting layer 106, and therefore, the light directed toward the outside of the pixel 10 is reflected by the inclining surface 104b of the first electrode 104 to be directed upward, namely, toward above the pixel 10, and thus is output. The light reflected by the first electrode 104 to be directed upward is incident on the color filter 111 located in the sealing film 108. The light L4 which has passed the color filter 111 is extracted as light of a color corresponding each pixel 10.

As described above, in the pixel 10 in the display device 200 in embodiment 2 according to the present invention, like in the pixel 10 in the display device 100 in embodiment 1 according to the present invention, the light L1, released from the light emitting layer 106, proceeds in the horizontal direction, namely, in a direction parallel to the top surface of the TFT substrate 101 and is reflected by the inclining surface 104b of the first electrode 104 to be directed upward. The light L1 is not directed to the adjacent pixels 10. Therefore, the light L1 output from the light emitting layer 106 can be effectively used as output light from each pixel 10.

Like the display device 100 in embodiment 1 according to the present invention, the display device 200 in embodiment 2 according to the present invention, even when being applied to a high-definition display, prevents light from leaking to the adjacent pixels and thus prevents color mixture. Therefore, the light extraction efficiency from each pixel 10 is improved.

Embodiment 3

Hereinafter, with reference to FIG. 12 through FIG. 17, a structure of a display device 300 in embodiment 3 according to the present invention will be described.

Figure 12:
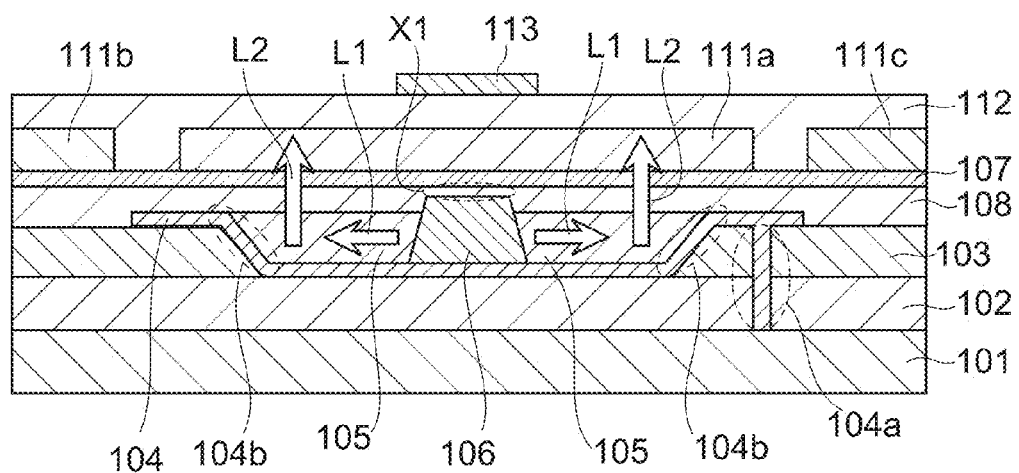
FIG. 12 is a cross-sectional view schematically showing a structure of a pixel in a display device in embodiment 3 according to the present invention.
Figure 13:
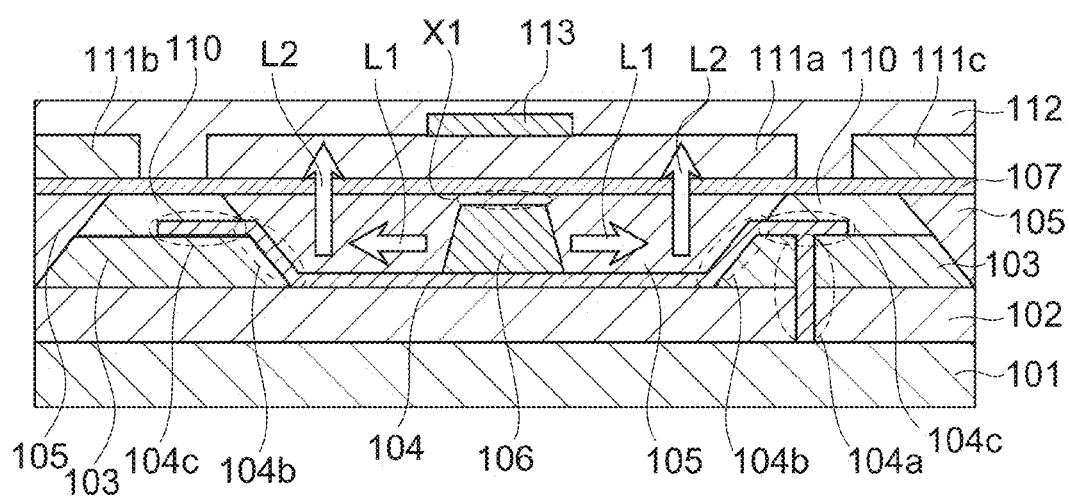
FIG. 13 is a cross-sectional view showing a modification example of the pixel in the display device in embodiment 3 according to the present invention.
Figure 14:
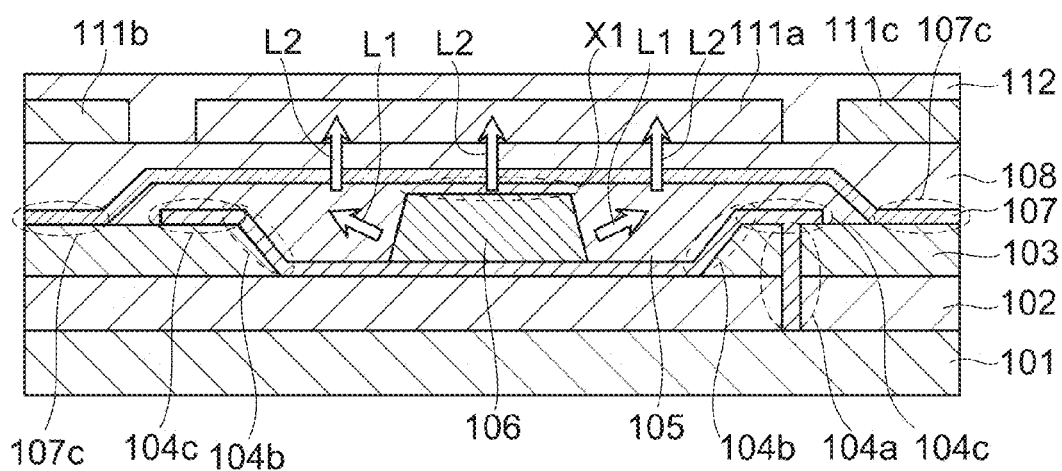
FIG. 14 is a cross-sectional view showing another modification example of the pixel in the display device in embodiment 3 according to the present invention.
Figure 15:
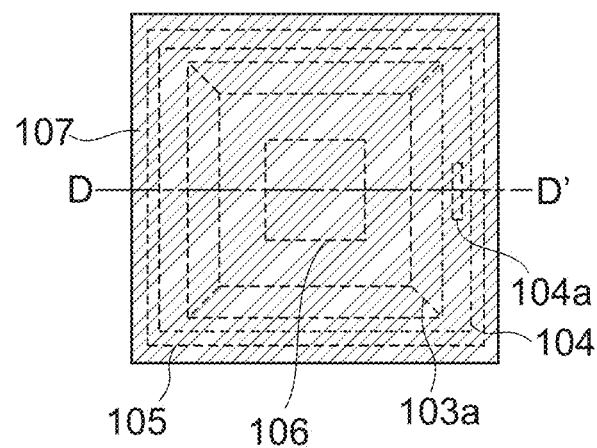
FIG. 15 is a plan view schematically showing a structure of the pixel in the display device shown in FIG. 14.
Figure 16:
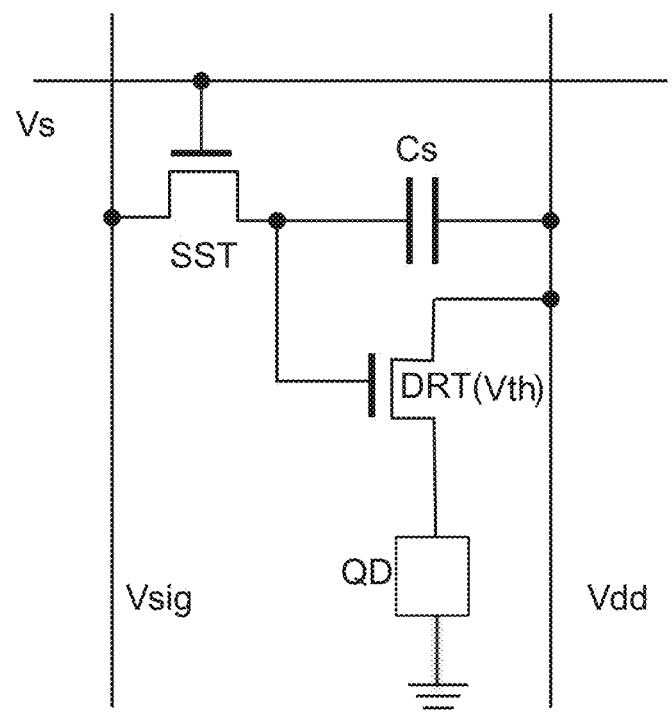
FIG. 16 is a circuit diagram showing an example of pixel circuit usable for the display device in embodiment 3 according to the present invention.

FIG. 12 is a cross-sectional view schematically showing a structure of a pixel 10 in the display device 300 in embodiment 3 according to the present invention. FIG. 13 is a cross-sectional view showing a modification example of the pixel 10 in the display device 300 in embodiment 3 according to the present invention. FIG. 14 is a cross-sectional view showing another modification example of the pixel 10 in the display device 300 in embodiment 3 according to the present invention. FIG. 15 is a plan view schematically showing a structure of the pixel 10 in the display device 300 shown in FIG. 14. FIG. 16 is a circuit diagram showing an example of pixel circuit usable for the display device 300 in embodiment 3 according to the present invention.

Unlike in the display device 200 in embodiment 2 according to the present invention shown in FIG. 8 through FIG. 11, in the display device 300 in embodiment 3 according to the present invention shown in FIG. 12, the second electrode 107 is located to extend throughout the plurality of pixels 10 and is provided commonly to all the pixels 10. The components substantially the same as those described above with reference to FIG. 8 through FIG. 11 will not be described in detail.

As shown in FIG. 12, in the pixel 10 in embodiment 3, like in the pixel 10 in embodiment 2, the first electrode 104 is located on a part of the top surface of the first insulating layer 102 that is in the opening 103a, and continuously on the top surface of the second insulating layer 103. On the first electrode 104, the light emitting layer 106 is located at a substantially central position of the pixel 10. In the opening 103a, the color conversion layer 105 is located on the first electrode 104 and adjacently to the side surface of the light emitting layer 106.

Unlike in the pixel 10 in embodiment 2, in the pixel 10 in embodiment 3, the second electrode 107 is located to extend throughout the plurality of pixels 10. The second electrode 107 is formed of a transparent conductive film on the light emitting layer 106 and acts as a transparent electrode common to all the pixels 10.

As shown in FIG. 12, the top surfaces of the light emitting layer 106, the color conversion layer 105, the first electrode 104 and the second insulating layer 103 are entirely covered with the sealing film 108. The second electrode 107 may be located on the sealing film 108. In this case, an area that is between the light emitting layer 106 and the second electrode 107 and is represented by dashed line X1 in FIG. 12 is filled with the sealing film 108, which is an insulating layer.

Even in the structure in which the sealing film 108 is located between the light emitting layer 106 and the second electrode 107, the light emitting layer 106 containing the quantum dots can release the light L1 by an electric field formed between the first electrode 104 and the second electrode 107. Therefore, the light emitting layer 106 is not limited to being located in direct contact with the first electrode 104 and the second electrode 107. As shown in FIG. 12, an insulating layer may be located between the light emitting layer 106 and the second electrode 107. In the case where an insulating layer, for example, the sealing film 108 in this embodiment, is located between the first electrode 104 or the second electrode 107 and the light emitting layer 106, the insulating layer desirably has a thickness of about 10 to 100 nm. Alternatively, like in the structures in embodiment 1 and embodiment 2 described above with reference to FIG. 2 through FIG. 11, the light emitting layer 106 may be in direct contact with the first electrode 104 and the second electrode 107.

As shown in FIG. 12, the substrate 112 having the color filters 111a through 111c formed thereon may be located on the second electrode 107. Between the substrate 112 having the color filters 111a through 111c and the second electrode 107, another interlayer film may be located.

As shown in FIG. 12, the substrate 112 having the color filters 111a through 111c may have a black matrix 113 provided thereon at a position overlapping the light emitting layer 106. The black matrix 113 is located above the top surface of the light emitting layer 106, and thus the quantum dots in the light emitting layer 106 are prevented from being excited by external light incident from the outside of the display device 300.

The second electrode 107 in embodiment 3 according to the present invention is grounded outside the display area 9. The second electrode 107 extend throughout the plurality of pixels 10 while covering the sealing film 108, which covers the second insulating layer 103, the first electrode 104, the color conversion layer 105 and the light emitting layer 106. Therefore, unlike in the case of the second electrode 107 in embodiment 1 or embodiment 2, in the case of the second electrode 107 in embodiment 3, it is not necessary to locate the through electrode 107a for grounding in each pixel 10 in the display area 9. Therefore, in this embodiment, it is not necessary to form the through electrode 107a and the contact hole for the through electrode 107a in each pixel 10, which contributes to improvement of the yield and reduction of production cost.

FIG. 13 is a cross-sectional view of a pixel 10 in the display device 300a in a modification example of embodiment 3 according to the present invention. As shown in FIG. 13, a third insulating layer 110 may be located between an end 104c of the first electrode 104 that is located on the top surface of the second insulating layer 103 and the second electrode 107. In the modification example shown in FIG. 13, the color conversion layer 105 may be located in a space enclosed by the first electrode 104, the second electrode 107 and the third insulating layer 110 and adjacently to the light emitting layer 106.

As shown in FIG. 13, the third insulating layer 110 is located to cover the end 104c of the first electrode 104 that is located at a perimeter of each pixel 10. The third insulating layer 110 thus located prevents light from leaking to other pixels 10 adjacent to the pixel 10 of interest in the horizontal direction. The third insulating layer 103 also prevents shortcircuiting between the first electrode 104 and the second electrode 107, and may act as a spacer keeping a distance between the first electrode 104 and the second electrode 107.

FIG. 14 is a cross-sectional view of a pixel 10 in the display device 300b in another modification example of embodiment 3 according to the present invention. As shown in FIG. 14, the color conversion layer 105 may cover the entirety of the first electrode 104 provided for each pixel 10 and may be located in a space around the light emitting layer 106, containing the quantum dots, between the first electrode 104 and the second electrode 107. In this modification example, the color conversion layer 105 is located on the top surface of the second insulating layer 103 to cover the end 104c of the first electrode 104. The color conversion layer 105 thus located prevents shortcircuiting between the first electrode 104 and the second electrode 107. The second electrode 107 provided commonly for the plurality of pixels 10, which covers the top surface of the color conversion layer 105, includes an area 107c in each pixel 10. The area 107c is in contact with the second insulating layer 103.

FIG. 15 is a plan view showing a structure of the pixel 10 shown in FIG. 14. In FIG. 15, the components located on the second electrode 107 are omitted. The cross-sectional view shown in FIG. 14 corresponds to a cross-sectional view taken along line D-D' in FIG. 15.

In the modification example of embodiment 3 according to the present invention shown in FIG. 14 and FIG. 15, the light emitting layer 106 is located at a substantially central position of each pixel 10, and the color conversion layer 105 is located on the top surface and the side surface of the light emitting layer 106 to fill the entire light emitting area of the pixel 10. The second electrode 107, which is transparent, extends through the plurality of pixels 10. Because of such a structure, a large area is usable as the light emission area of the pixel 10, which improves the light emission efficiency and also the viewing angle.

FIG. 16 is a circuit diagram showing an example of pixel circuit usable for the display devices 300 in embodiment 3 according to the present invention shown in FIG. 12 through FIG. 15. The components substantially the same as those described above with reference to FIG. 4A will not be described in detail.

In FIG. 16, like in FIG. 4A, an element including the first electrode 104, the second electrode 107, and the light emitting layer 106 containing the quantum dots (QDs) that is located between the first electrode 104 and the second electrode 107 is represented by "QD". In embodiment 3 according to the present invention, the second electrode 107 is a common electrode that is common to the plurality of pixels 10. Therefore, the second electrode 107 in the "QD" may be grounded. Because of the structure of the pixel circuit shown in FIG. 16, the light emission of the light emitting layer 106 in the "QD" can be controlled by a potential difference between the first electrode 104 and the second electrode 107.

Figure 17:
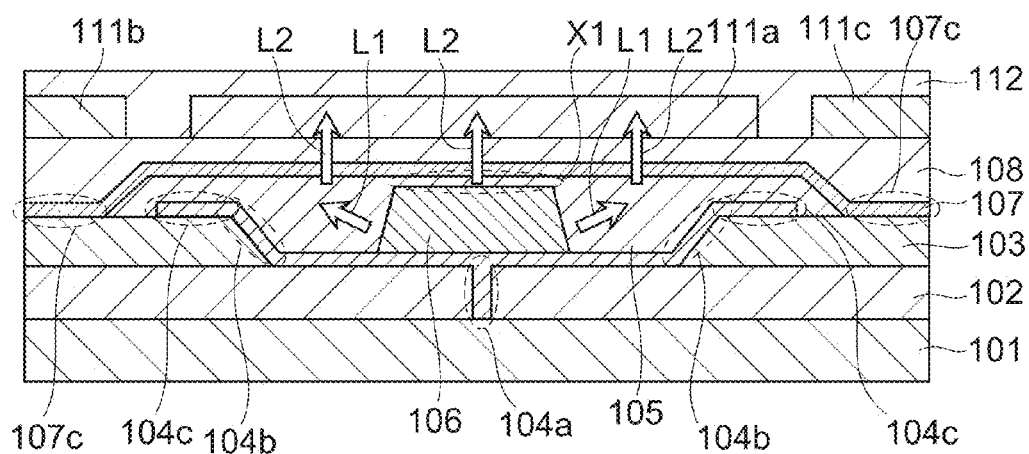
FIG. 17 is a cross-sectional view showing still another modification example of the pixel in the display device in embodiment 3 according to the present invention.

In the structures shown in the cross-sectional views in FIG. 12 through FIG. 14, the through electrode 104a in the contact hole may be located just below the light emitting layer 106 instead of in the second insulating layer 103. FIG. 17 shows a pixel 10 having such a structure. FIG. 17 is a cross-sectional view showing the pixel 10 in a display device 300c in embodiment 3 according to the present invention. In this case, the space usable for the layout of the components is enlarged.

In the pixel 10 in embodiment 3 according to the present invention described above with reference to FIG. 12 through 17 also, the light L1 released from the light emitting layer 106 between the first electrode 104 and the second electrode 107 is incident on the color conversion layer 105 and then is reflected by the inclining surface 104b of the first electrode 104 located below the color conversion layer 105, and is directed upward. This prevents the light L2 from leaking to the adjacent pixels 10.

In any of the display devices including the light emitting layer 106 containing the quantum dots in embodiments 1 through 3 according to the present invention, light leak to the adjacent pixels 10 is prevented, and thus color mixture among pixels 10 is prevented. Therefore, the light released from the light emitting layer 106 can be effectively used as output light from each pixel 10. As a result, the light extraction efficiency is improved. Such a display device can be realized with a simple structure without significantly changing a currently used production method.

The invention claimed is:

1. A display device including a plurality of pixels on a substrate, each of the plurality of pixels comprising:
   a first electrode on the substrate;
   a quantum dot material on the first electrode;
   a second electrode on the quantum dot material, the second electrode has a light transparent property;
   a color conversion material on the first electrode, the color conversion material is located adjacent to and in contact with a side surface of the quantum dot material; and
   a light shielding film on the quantum dot material,
   wherein each of the plurality of pixels has a first region and a second region,
   wherein in the first region in plan view, the quantum dot material overlaps the first electrode, the second electrode overlaps the quantum dot material, and the light shielding film overlaps the quantum dot material, and
   wherein in the second region in plan view, the color conversion material overlaps the first electrode and the light shielding film does not overlap the color conversion material.

2. The display device according to claim 1, wherein a first insulation film is arranged on the substrate,
   wherein a second insulation film is arranged on the first insulation film and has an opening which exposes the first insulation film and which has an inclining surface and a bottom surface, and
   wherein the first electrode is arranged on the inclining surface and the bottom surface of the opening of the second insulation film.

3. The display device according to claim 1, wherein the pixel has a third region,
   wherein in the third region in plan view, the color conversion material overlaps the first electrode and the second electrode overlaps the color conversion material, and
   wherein in plan view, the third region is arranged between the first region and the second region.

4. A display device including a plurality of pixels on a substrate, each of the plurality of pixels comprising:
   a first layer including a first electrode on the substrate;

a second layer including a quantum dot material and a color conversion material on the first layer, the color conversion material is located adjacent to and in contact with a side surface of the quantum dot material;

a third layer including a second electrode on the second layer, the second electrode has a light transparent property; and a light shielding film on the quantum dot material, wherein each of the plurality of pixels has a first region and a second region, wherein in the first region in plan view, the quantum dot material overlaps the first electrode, the second electrode overlaps the quantum dot material, and a light shielding film overlaps the quantum dot material, wherein in the second region in plan view, the color conversion material overlaps the first electrode and is arranged beside the light shielding film, and wherein in the first region, the quantum dot material is located in contact with the first electrode wherein in the second region in plan view, the light shielding film does not overlap the color conversion material.

5. The display device according to claim 4, wherein a first insulation film is arranged on the substrate, wherein a second insulation film is arranged on the first insulation film and has an opening which exposes the first insulation film and which has an inclining surface and a bottom surface, and wherein the first electrode is arranged on the inclining surface and the bottom surface of the opening of the second insulation film.

* * * * *